US006185709B1

(12) United States Patent
Dreibelbis et al.

(10) Patent No.: US 6,185,709 B1
(45) Date of Patent: Feb. 6, 2001

(54) DEVICE FOR INDICATING THE FIXABILITY OF A LOGIC CIRCUIT

(75) Inventors: Jeffrey Harris Dreibelbis, Williston; Rex Ngo Kho, Bristol; Leo Armand Noel, Essex Junction, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/108,069

(22) Filed: Jun. 30, 1998

(51) Int. Cl.$^7$ ................................................ G01R 31/28
(52) U.S. Cl. .................. 714/726; 714/729; 714/733; 365/200; 365/201
(58) Field of Search .................... 714/726, 727, 714/729, 733; 365/200, 201, FOR 131, FOR 132, FOR 134

(56) References Cited

U.S. PATENT DOCUMENTS

| 4,000,460 | * | 12/1976 | Kadakia et al. | 714/726 |
|---|---|---|---|---|
| 4,298,980 | * | 11/1981 | Hajdu et al. | 714/726 |
| 4,460,999 | | 7/1984 | Schmidt | 714/711 |
| 4,586,178 | * | 4/1986 | Bosse | 714/711 |
| 4,627,053 | | 12/1986 | Yamaki et al. | 714/711 |
| 4,639,915 | | 1/1987 | Bosse | 714/711 |
| 4,736,373 | | 4/1988 | Schmidt | 714/711 |
| 4,794,599 | * | 12/1988 | Purcell et al. | 714/719 |
| 4,833,652 | | 5/1989 | Isobe et al. | 365/201 |
| 5,054,024 | * | 10/1991 | Whetsel | 714/726 |
| 5,363,382 | | 11/1994 | Tsukakoshi | 714/719 |
| 5,577,050 | | 11/1996 | Bair et al. | 714/710 |
| 5,581,541 | * | 12/1996 | Whetsel | 370/241 |
| 5,631,868 | | 5/1997 | Termullo, Jr. et al. | 365/200 |
| 5,654,970 | * | 8/1997 | DaCosta et al. | 714/726 |
| 5,671,185 | | 9/1997 | Chen et al. | 365/200 |
| 5,694,359 | | 12/1997 | Park | 365/185.09 |
| 5,784,384 | * | 7/1998 | Maeno | 714/726 |
| 5,862,152 | * | 1/1999 | Handly et al. | 714/727 |
| 5,872,908 | * | 2/1999 | Whetsel | 714/726 |
| 5,907,562 | * | 5/1999 | Wrape et al. | 365/201 |
| 5,909,451 | * | 6/1999 | Lach et al. | 714/726 |
| 5,961,653 | * | 10/1999 | Kalter et al. | 714/7 |

FOREIGN PATENT DOCUMENTS 992026   6/1993  (FR).

OTHER PUBLICATIONS

Akrout, et al., (Multi–Scan Array Built–in, Self–Test with Result/Fail Bits, IBM Technical Bulletin, vol. 36, No. 7, Jul. 1993).*
Nadeau–Dostie, et al., (A Serial Interfacing Technique for Built–in and External Testing of Embedded Memories, IEEE, Jun. 1989).*
Dewar, D.R., "Method of Identifying Non–Repairable Fail Patterns, " IBM Technical Disclosure Bulletin, vol. 32, No. 3A (Aug. 1989) pp. 427–428.
Akrout, C., et al., "Multi–Scan Array Built–In, Self–Test with Result/Fail Bits," IBM Technical Disclosure Bulletin, vol. 36, No. 07 (Jul. 1993) pp. 197–198.

* cited by examiner

Primary Examiner—Albert De Cady
Assistant Examiner—Guy Lamarre
(74) Attorney, Agent, or Firm—Pollock, Vande Sande & Amernick, RLLP; H. Daniel Schnurmann

(57) ABSTRACT

A device for testing the fixability of logic circuits having an embedded memory. The logic circuit includes a built-in test circuit for generating data which tests the embedded memory. An allocation logic circuit provides an output line for each bit of the memory identifying if the bit has either failed or passed. A Failed Data Bit Register is connected to the output lines. The Failed Data Bit Register includes a plurality of shift register stages. A multiplex circuit associated with each stage of the shift register receives as a first input the corresponding output line of the allocation logic circuit. A second input of the multiplex circuit connects to the preceding stage of the shift register. A clock cycle counter connects to an enabling line of the multiplex circuits and to a source of clock pulses. The clock cycle counter enables the plurality of multiplex circuits to cycle data from the allocation logic circuit through the plurality of stages until it is completely cycled through the plurality of stages. A fail counter is connected to the last stage and counts the number of times Failed Data Bits have been produced by recycling the data.

13 Claims, 3 Drawing Sheets

DEVICE FOR INDICATING THE FIXABILITY OF A LOGIC CIRCUIT

RELATED APPLICATIONS

This application is related to U.S. patent application Ser. No. 08/803,053, filed Feb. 19, 1997, now U.S. Pat. No. 5,961,653.

BACKGROUND OF THE INVENTION

The present invention relates to testing and repairing of electronic circuits such as logic circuits, memory circuits and combinations thereof including a memory embedded in a logic chip. Specifically, a device is provided which uses Built-In Self Test (BIST) circuitry to detect failed memory cells in a memory, and to indicate whether or not the memory can be repaired by substituting redundant rows and/or columns for defective rows and columns of the memory array. Significant advantages in electronic circuitry are realized when random access memories are embedded with logic on the same integrated circuit chip. Significant improvement in circuit performance, while effectively utilizing chip area, occurs because of the improved communication between the logic and embedded memory. In stand alone memory circuits, 16- or 32-bit input/outputs are provided having dedicated input/output pins on the memory chip which communicate off chip over a data bus. The bus overhead necessary in order to read and write to the memory, requiring numerous bus cycles to transfer data into and out of the memory, reduces the efficiency of the memory. Combining the logic circuitry on the same circuit chip permits direct connection to the input/output lines of the memory avoiding the bus overhead incurred in communication between chips.

Embedding memory devices such as static random access memories (SRAMs) or dynamic random access memories (DRAMs) having wider outputs, for instance, memories which have 128, or 256 bit outputs which are directly connected to the logic without a bus interface is especially advantageous.

The combination of memory with logic on the same chip, particularly where DRAMs are used for the memory device, produces significant manufacturing problems. For instance, the DRAM cells are sensitive to minor defects that the more durable logic will withstand. The logic may require extra wiring layers to allow tightly packed logic cells to be interconnected. The wiring necessary for the logic may, however, impair transmitted signal margins, and otherwise decrease chip yield. An additional serious consequence is the effect of testability of a chip having the embedded memory. On-board Built-In Self Test (BIST) circuitry is provided to produce a set of complex data patterns, address sequencing, and control signals to check the logic circuitry and connected memory elements. The BIST circuitry includes logic circuitry which is used to identify failed memory cells, and to allocate replacement memory cells for the failed cells. In an embedded DRAM the results of testing word lines of memory cells, as well as column lines of memory cells may be provided to the allocation logic circuit to identify failed memory cells. Faulty word line addresses are stored in a wordline register, and redundant word line memory cells in the DRAM are assigned to replace the failed wordlines by the allocation logic. The fixability of the DRAM macro, i.e., the ability to replace all defective memory cells with redundant memory cells, may be determined from an overflow bit in the register storing the faulty word line addresses. If there is an overflow bit, indicating that more word line memory elements have failed than can be replaced by redundant memory word line elements, the inability to fix the embedded DRAM is easily determined by a connected tester which monitors the overflow bit.

In some memory designs, redundant columns of memory elements are also provided to replace defective columns. As in the case of word line replacement, a second register is provided which produces an overflow bit, indicating that the number of redundant columns available for replacement have been exhausted. By ORing the overflow bits for each of the word line address registers and column line address registers, an indication of memory fixability is available to a connected tester.

Embedded memories which are organized as 128 or 256 bits wide where each bit represents a data slice derived from a memory array, do not utilize column redundancy, as it would require a large number of redundant columns increasing chip area overhead. These embedded memories provide redundant word line memory cells, along with redundant data slice arrays. Each of the memory output data bits, therefore, do not have a logical address to permit the use of the Failed Address Registers to identify the fixability of a memory. Thus, the tester does not have a way of determining whether there are more memory cell faults than there are redundant replacement cells which can be assigned to replace failed memory cells. Thus, a connected tester must download significant amounts of data from the allocation logic circuit in order to determine whether the embedded DRAM macro is fixable.

The present invention relates to an on board circuit for compressing the data output from the allocation logic to determine whether or not sufficient redundant memory elements are available to render the embedded DRAM macro fixable.

BRIEF SUMMARY OF THE INVENTION

It is an object of this invention to provide an on-chip testing device which produces a bit indicating the repairability of a logic circuit.

It is a more specific object of this invention to provide a single bit output to a connected tester to indicate if an embedded memory of a logic circuit is not repairable.

The invention provides a device for testing the fixability of a logic circuit which is tested using a specific test pattern. The test pattern provides a known stimulus to the logic circuit, and a response thereto is recorded in a register. The register comprises a plurality of stages, forming a failed data bit register. Multiplexer circuits are provided between each stage, permitting failed data bits recovered from the tested logic circuit to be stored as serial data within the register.

The contents of the register are shifted out at a convenient time, by circulating the contents of the bit register whereby the failed data bits are produced from the last stage indicating the number of failures in the tested logic circuit.

The invention in accordance with a preferred embodiment is provided in a logic circuit having an embedded memory. A Built-In Self Test (BIST) circuit generates data for testing the embedded memory, and an allocation logic circuit connected to the memory and to the test circuit identifies each bit output line of the memory which has failed or passed with a logical "1" or "0". An level sensitive scannable register (LSSD) includes a plurality of serially connected stages. Each output bit from the allocation logic circuit is connected through a first input of a multiplex (MUX) circuit to one of the stages. The second input of the multiplex circuit is connected to the output of the preceding stage of the shift register. The last stage of the shift register, which receives the highest order bit from the allocation circuit, is connected to the multiplex circuit of the first stage which receives the lowest order bit from the allocation logic circuit.

At the end of a test cycle initiated by the BIST circuit, a Clock Cycle Counter is enabled, generating a series of clock pulses for enabling the multiplex circuit. Enablement of the multiplex circuits result in cycling of the data from the allocation logic circuit through the plurality of stages, and thence back to the first stage. A fail counter counts the number of times Failed Data-Bits are produced by the last of the stages, thus providing an indication of the number of memory elements which have failed. The fail counter produces a fixability flag when the number of fail counts exceeds the number of redundant circuits indicating the memory is not repairable. A connected tester examines the contents of the fail counter to establish whether or not the logic circuit having the embedded memory is repairable.

DESCRIPTION OF THE PREFERRED EMBODIMENT

Figure 1:
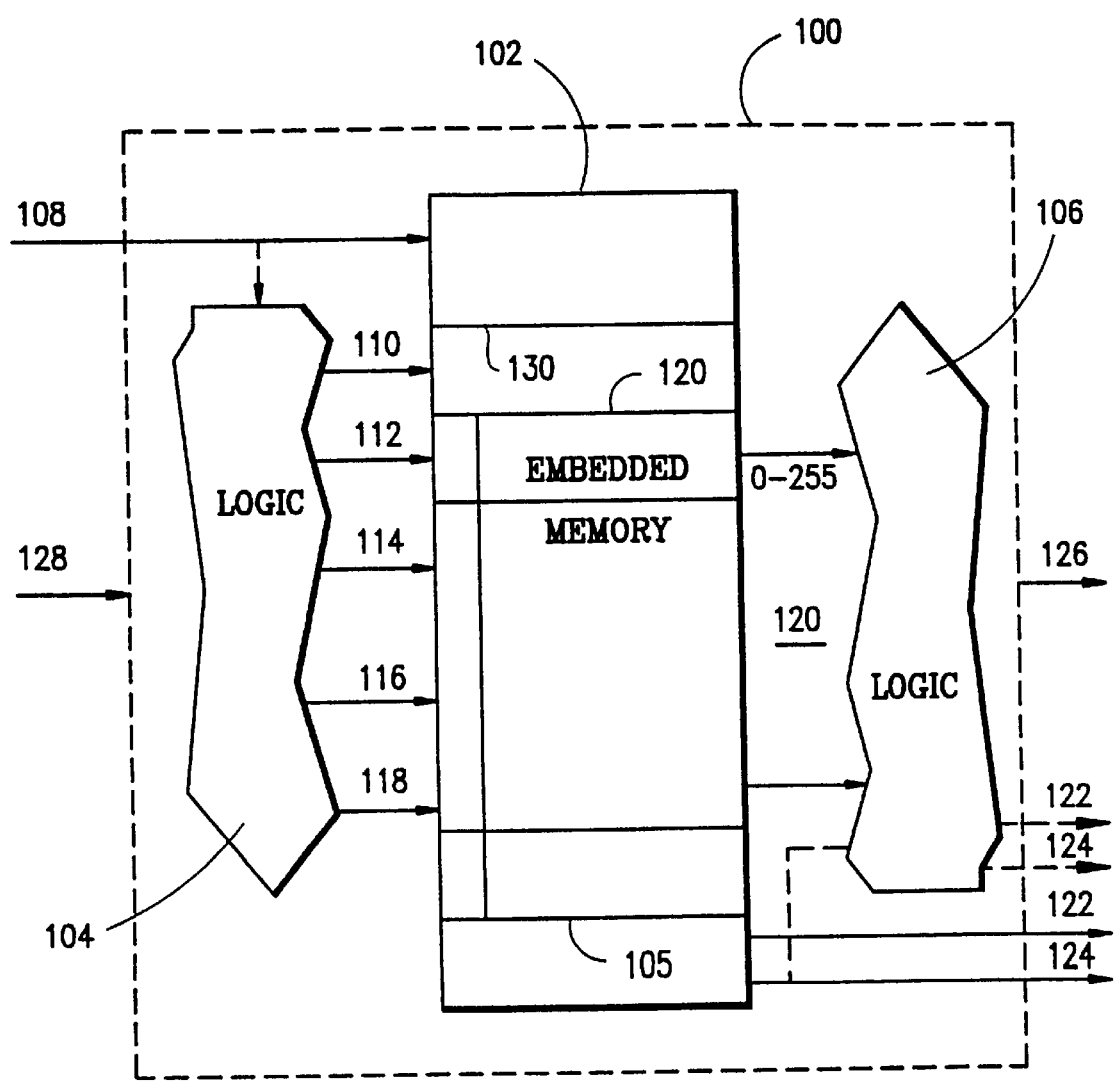
FIG. 1 is a block diagram of an ASIC circuit having an embedded memory macro.

FIG. 1 illustrates an integrated circuit having a random access memory embedded in an application specific logic chip (ASIC) logic chip 100. The embedded memory may be a wide input/out memory, having outputs 0–255 connected to a logic circuit 106. The memory output lines 0–255 each constitute a bit slice comprising a subarray of 16 columns by 256 rows. Like numbered row lines of each data slice 130 are connected together and are addressed through a common address line connected to logic circuit 104. The columns of the data slices have address lines connected to the logic circuit 104.

The logic circuit 104 provides outputs which are used to address the embedded memory 102. The inputs/outputs 0–255 of the memory are connected to further logic circuitry 106. The embedded memory has redundant bit slices 105, which are substituted for other bit slices, when during the self-test it is determined that a bit slice is defective. While shown and described as a 256 bit wide DRAM, it is clear that other memory output widths may be employed. Also included on the logic chip 100 is a Built-In Self Test (BIST) circuit which is used to test the embedded memory 102.

The device of FIG. 1 includes conventional memory control lines such as bit write controls 112, read/write controls 114, address inputs 116, test controls 118, data input lines 110 and an off chip enable line 108.

The chip includes BIST outputs 122 and scan outputs 124. The scan outputs 124 and BIST outputs 122 may pass through the logic 106 as it leaves the integrated circuit 100. The outputs 126 from the chip 100 come from logic 106, and the inputs to the integrated circuit 100 are represented as 128. The ASIC logic chip 100 makes use of a combination of logic on the same chip within embedded memory, and the embedded memory 102 is dedicated to the on chip logic circuitry and is not directly accessed by other chips in the circuit configuration. In this way, the wide width output 120 may be directly connected to the logic circuitry without any of the bus overhead which is needed for a stand alone memory to transfer data off chip.

Figure 2:
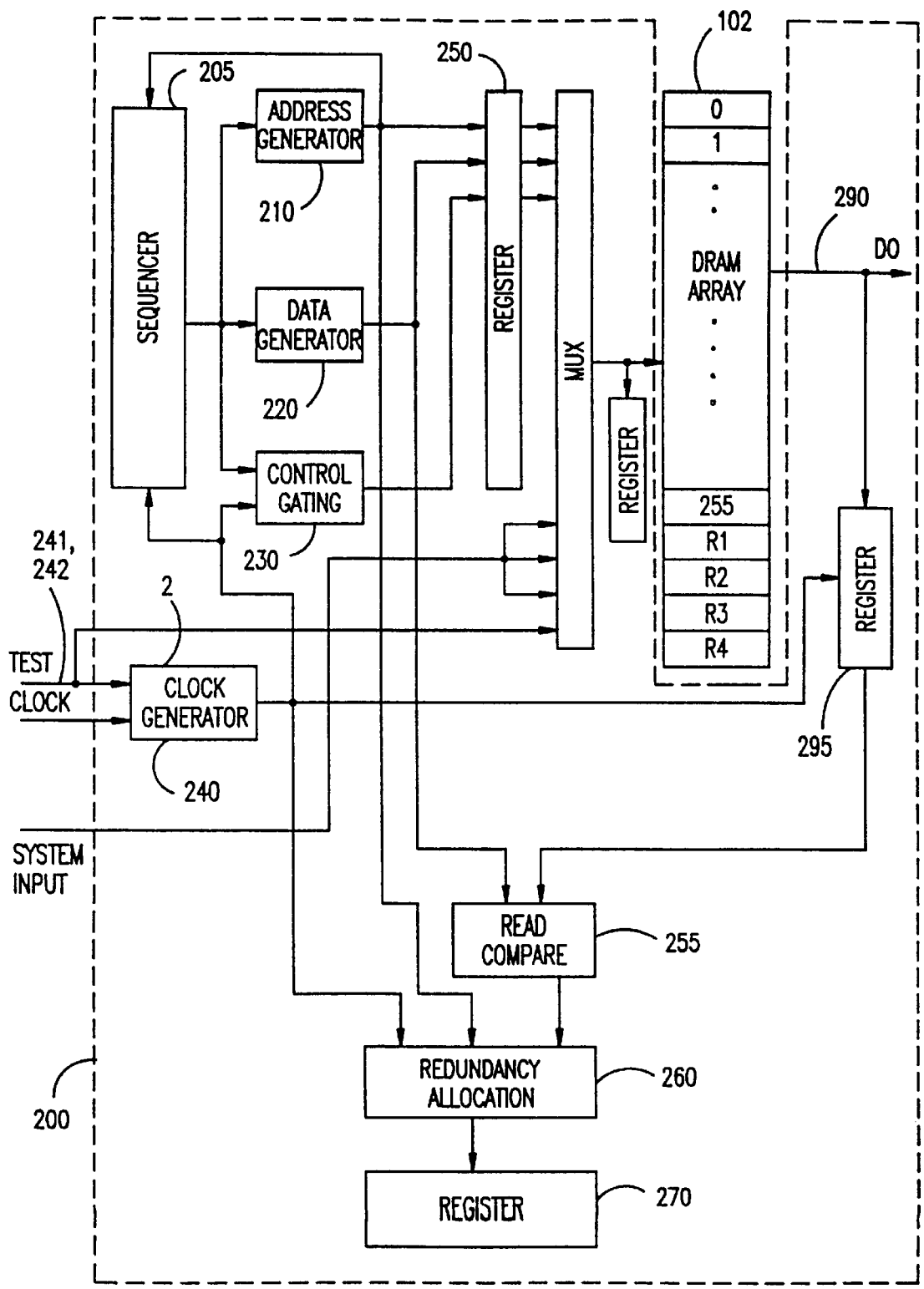
FIG. 2 is a more detailed block diagram of the ASIC circuit of FIG. 1 showing details of the BIST circuit and test features of the ASIC.

FIG. 2 is a more detailed description of the embedded DRAM array 102 along with a BIST circuit 200 which is used to test the DRAM array 102. The BIST circuit 200 generates sequences in the sequencer 205 for producing test words which identify and execute test instructions which provide a test pattern for the DRAM array 102.

A data generator 220 is responsive to the test pattern produced from the sequences, creating a data input to the DRAM array 102. Simultaneously, address sequences are generated from address generator 210 for directing the test pattern to the appropriate memory locations of the memory 102.

The data generator 220 also provides comparison data which is sent to a comparator 255. The comparison data is compared with output data from the memory 102, to determine whether or not a bit slice may contain a failed memory cell. Further, the data generator also creates read/write control inputs for the memory array 102 during the BIST test cycles when the test pattern is applied to memory 102.

The control gating block 230 provides control signals to the DRAM array 102 that are appropriate for the applied test pattern and test cycle being applied to the memory 102. The control gating block 230 also generates a data output strobe, synchronized with a clock signal from clock generator 240, which is in turn synchronized to the memory array 102 input control signals. The clock generator 240 is responsive to two off chip clock inputs, tstnl 241 and tstno 242 from an tester. This provides several internal system clock options under the control of the tester, including a scan mode for LSSD testing, BIST circuit initialization, the shaping of a clock pulse by programming the duty factor during initialization and switching from single access mode to a page mode, etc.

The BIST circuit 200 includes redundancy allocation logic 260 which monitors all the data comparison failures obtained from the compare circuit 255, and determines an efficient use of the redundant Wordlines and redundant bit slices R1, R2, R3 and R4 in the DRAM array 102. The output data from the DRAM array 102 which is observed at output lines 290 representing the full width of the memory array as well as the additional width presented by redundant data slices R1, R2, R3 and R4, are stored in output register 295 associated with DRAM array 102. Under control of the clock generator 240, the data from each test pattern, representing two different voltages, is used by redundancy allocation circuit 260 to determine the best possible allocation of spare wordlines and bit slices R1–R4 as replacements for defective wordlines and bit slices in the memory array 102. An level sensitive scannable register (LSSD) 270 receives the results of a determination by the redundancy allocation logic circuit 260 identifying failed wordline and bit slices. The LSSD register 270 is commonly used to serialize test data which is produced internal to a circuit by a known stimulus. The register 270 has outputs which are accessible by a tester module connected to the embedded logic circuit. As set forth in the previously identified patent application, herein incorporated by reference, maximum repairability relies upon establishing the best possible use of the available wordline and bit slice redundancy. Typically, for a stand alone memory, allocation is called for by a memory tester capable of storing data identifying all the memory locations that were tested. A Bit Fail Map database is derived by the tester processor to establish an optimum means for repairing a defective memory array. Two dimensional redundancy means such as are set forth in the foregoing identified patent application essentially combines spare Wordlines and spare column lines as replacements for defective memory cells.

Register 270 includes a Failed Wordline address Register, as well as a Failed Data Bit Register. The address of a Failed Wordline found in array 102 is stored in the Failed Wordline Address Register. The size of the Failed Wordline Address Register is R×A, where R is the number of available redundant wordlines which are common for all data slices in the memory array 102 which may be assigned in place of defective word lines. A is equal to the number of word address bits plus 1, the extra bit being used to indicate whether it is in use or not.

A Failed Data Bit Register is also provided, organized as 1×B, where B is equal to the I/O data width of the memory array 102, plus the number of redundant data slices provided which, in the example of FIG. 2, is 4. The Failed Data Bit Register is pitch matched to the output of the memory array 102, having one-to-one correspondence. The Failed Data Bit Register is LSSD scannable, as is the Failed Wordline Address Register. The LSSD register is a master slave latch configuration where non-overlapping clocks clock data into the master latch, and then shift the data into the respective slave latch. The LSSD scannable register is commonly used in scan string configuration to realize test data, for evaluating the circuit response to a known stimulus. Thus, the data pattern contained in these registers when unloaded during a scan string identifies wordline or data slices which are defective and must be replaced by a redundant wordline or data slice.

Prior to replacing defective wordlines or data slices, it is necessary to determine whether there is sufficient wordline and data slice redundancy to repair the memory array 102. The present invention determines the fixability, i.e., whether sufficient redundancy exists to permit the memory to be repaired.

Following the loading of data by the allocation logic circuit 260, the Failed Data Bit Register is consulted to determine whether the device can be fixed using redundant Wordlines and data slices. In accordance with rules that have been determined for optimum repairability, the "must-fix" assignments are made by the allocation logic circuit 260 for the redundant wordlines and data slices. This results in priority being given to fixing faults in one specific dimension, because there are more faults in that dimension than there are redundant elements in the opposite dimension. The remaining faults (either wordline failure or bit slice failure) are assigned redundant wordlines, and then redundant data slices when all the redundant wordlines have been used.

The failed data bits are identified by the contents of the Failed Data Bit Register. The repairability of the memory array 102 may be determined by counting the "1"s representing failed data bits in the Failed Data Bit Register following its assignment of the spare wordlines. If there are more "1"s than there are redundant data slices, the memory array 102 is not repairable. Conversely, if the number of "1"s in the Failed Data Bit Register is less than or equal to the number of redundant data slices, the memory array 102 is always fixable. The Failed Data Bit Register may then be used to provide a fixable status to a connected tester, without downloading the entire database of the redundancy allocation logic.

Figure 3:
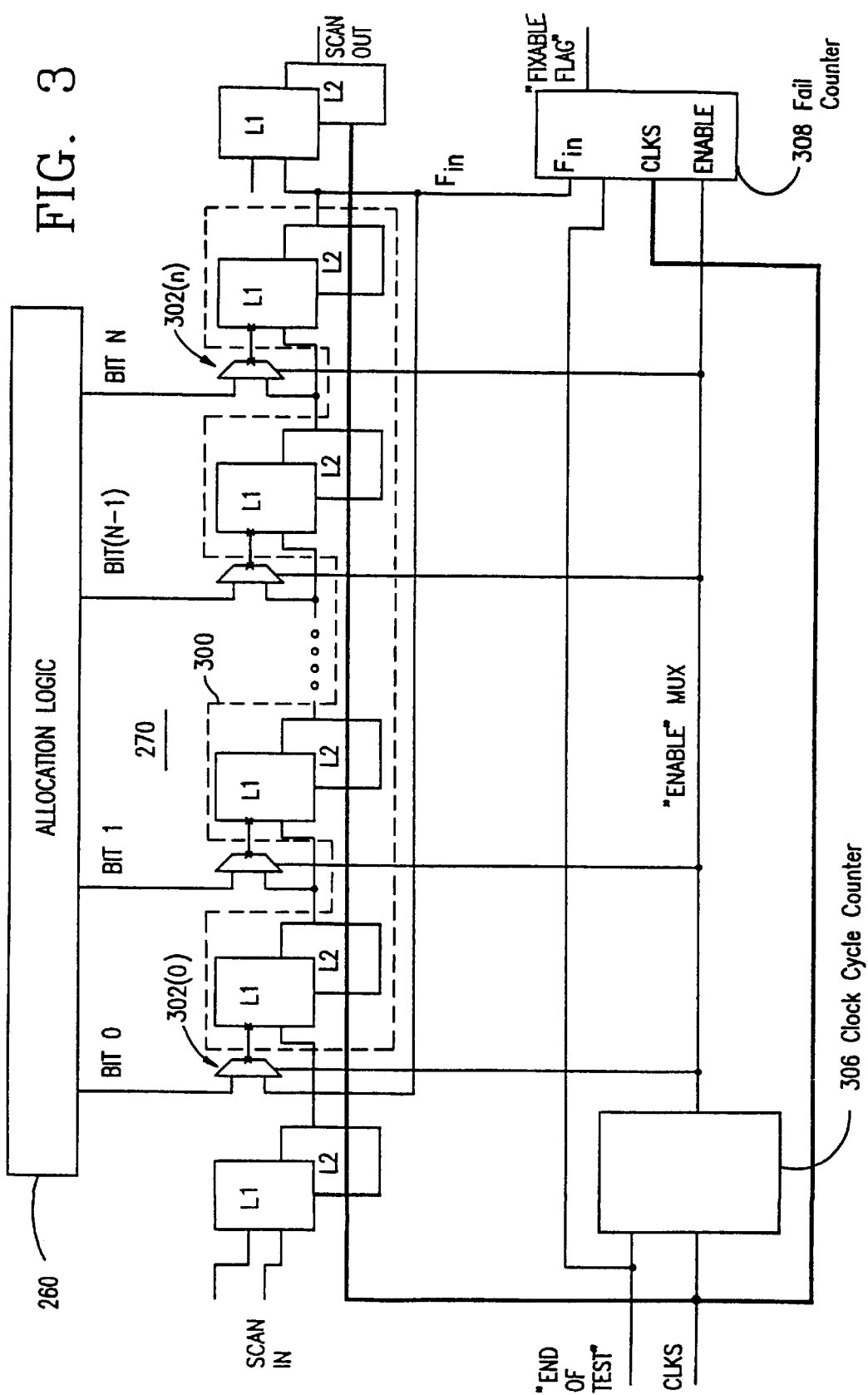
FIG. 3 is a schematic drawing of a bit failure register in accordance with a preferred embodiment of the invention.

Referring now to FIG. 3, a modification of the Failed Data Bit Register is shown which provides for a single bit which indicates the repairability of the memory array 102.

The Failed Bit Register 270 comprises 260 stages (256 plus 4 redundant stages) to accommodate the bits representing the failure status of each output bit of the memory array 102. The Failed Bit Register 300 stages, comprise a master/slave latch L1, L2 storing the status of an output bit.

The bits representing the failure status of the memory array 102, as determined by the redundancy allocation stages circuit 260, are received from lines 0-n connected to the redundancy allocation logic circuit. A two-to-one multiplex circuit 302 is provided at the input of each stage of the Failed Bit Register. The two inputs of the multiplex circuit 302 are connected to the output bit from the redundancy allocation logic, and the output of the preceding stages slave latch L2, respectively. In the case of the first and last stages of the Failed Bit Register 300, the output of the Last Stage is fed back to the input of the first stage of the register.

When the test circuit has completed all pattern checks and comparisons between input data and output data of the memory array 102, an End-Of-Test flag is set by the BIST circuit. A Cycle Counter 306 enables the multiplex circuit 302 of each stage in response to the End-Of-Test condition. The two-to-one multiplex circuit 302 of each stage of the Failed Bit Register provides as an input to a respective stage the output of the preceding stage. The successive clock cycles, following the End-Of-Test flag renders the memory control clock inactive, and serially shifts the Failed Data Bit Register 300. The Failed Data Bit Register 300 serially shifts its contents one complete time through the register stages, ending with its contents exactly as they were when the End-Of-Test flag was received. The Clock Cycle Counter 306 enable goes LOW following the generation of the clock pulses for cycling the Failed Data Bit Register one complete time. In the case of a 256 bit wide memory array 102 having four redundant slices a total of 260 clock cycles are necessary for completely cycling the Register 300 contents.

The Failed Bit Data Register 300 is part of a larger LSSD Register, including the Failed Wordline Address Register, and includes other data bits for analyzing operability of the integrated circuit 100. The remainder of the scannable register remains uncorrupted because the End-Of-Test flag prevents further cycling of the BIST circuit. In accordance with the embodiment of FIG. 3, the Failed Data Bit Register 300 acts as a small shift register within a normal, much larger shift register. The output of the last bit of the register is used as an input to a Failed Bit Counter 308. The Failed Bit Counter 308 may have a default output representing a count of 4 or less, indicating to a connected tester that the array contains 4 or fewer data slice faults. In the event that more than 4 failed data bits have been produced at the last output stage of the Failed Data Bit Register 300, a flag is asserted at its output, indicating that the number of failed data slices exceeds the number of redundant data slices indicating the memory as not fixable.

While the preferred embodiment has been described with respect to a logic circuit having an embedded memory with a built-in self-test circuit for generating test patterns, it is equally applicable to other types of computer driven automatic testing schemes which provide a test pattern as a known stimulus to a circuit under test. The invention is applicable to those systems which provide test patterns which are heuristic, random, or of any other configuration used for testing logic circuits. Further, while the preferred embodiment is described with respect to use of a level-sensitive scannable register having a plurality of stages, other register configurations are possible which provides for storage of failure data in a shift register having contents shiftable to the last stage thereof.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A device for testing the fixability of a logic circuit tested using a test circuit which provides a known stimulus to the logic circuit and records the response thereto in a shift register comprising:

a plurality of multiplexer circuits, each multiplexer circuit having an output connected to one of a plurality of stages of said shift register, said stages forming a failed data bit register, said multiplexer circuits having a first input connected to receive a failed data bit from said test circuit indicating a circuit failure, and a second input connected to an output of a previous stage, a last of said stages providing an input to the second input of the multiplexer circuit of a first stage;

a counter for enabling said multiplexer circuits to circulate the contents of said stages whereby failed data bits are produced from said last stage indicating a number of failures in said logic circuit; and means for counting said data bits produced by said last stage.

2. The device according to claim 1 wherein said means for counting said failed data bits produces an output flag indicating the relationship between the number of defective memory cells and a number of replacement memory cells of an embedded memory in said logic circuit.

3. The device according to claim 2 wherein said counter for enabling said multiplexer circuit is enabled by an end of test flag produced by a built in test circuit.

4. The device according to claim 2 whereby said counter for enabling said multiplexer circuits applies clock pulses to said multiplexer circuits following receipt of said end of test flag for circulating said failed data bits in said register stages.

5. The device according to claim 1 wherein said stages constitute a subset of a level sensitive scannable register.

6. A device for testing the fixability of logic circuits having an embedded memory comprising:

a built in test circuit for generating data for testing said memory;

an allocation logic circuit which provides an output line for each bit of said memory identifying said bit as either failed or passed;

a Failed Data Bit Register connected to receive each of said output lines comprising:

a level sensitive scannable register (LSSD) having a plurality of stages;

a plurality of multiplexer circuits one of each being associated with each stage, having a first input, a second input, an enable input and an output, the output of each multiplexer being connected to an input of a respective stage, said first input receiving one of said allocation logic circuit output lines, the second input connected to a preceding shift register stage output, the output of a last of said plurality of stages being connected to the second input of a multiplexer connected to a first of said stages;

a counter connected to each enable input and to a source of clock pulses, said counter enabling said plurality of multiplexer circuits to cycle data from said allocation logic circuit through said plurality of stages until said data is completely cycled through said plurality of stages; and a fail counter for counting the number of times fail data bits are produced by said last of said stages.

7. The device according to claim 6, wherein said fail counter provides an output when the number of Fail Data Bits exceeds a first predetermined number to indicate that the number of failed memory cells exceeds the number of spare memory cells which may be used to replace failed memory cells.

8. The device according to claim 7, wherein said predetermined number represents the number of redundant data bits of said memory.

9. The device according to claim 6, wherein said counter for enabling said multiplexer circuits is enabled by an End-Of-Test flag generated by said built-in test circuit.

10. The device according to claim 6, wherein said plurality of stages equal the width of said memory plus the number of redundant data bits which can be assigned to said memory.

11. A device for testing the fixability of logic circuits having an embedded memory comprising:

a built-in test circuit for generating data for testing said memory;

an allocation logic circuit which provides an output line for each bit of said memory identifying said bit as either failed or passed;

a Failed Data Bit Register connected to receive data from each of said output lines comprising:

a level sensitive scannable register (LSSD) having a plurality of stages which are connected to each other, a portion of said plurality of stages having an input connected to an allocation logic circuit output line through a multiplexer, or an output of a preceding stage, depending on the state of an enable signal applied to said multiplexer; and counter means connected to enable said multiplexer following an End-Of-Test signal generated by said test circuit; whereby the contents of said portion of said plurality of stages are serially produced at a last stage of said portion of stages indicating the number of failed bits of said memory.

12. The device according to claim 11 further comprising:

a counter for accumulating the number of failed bits produced by said last stage.

13. The device according to claim 11, wherein said last stage of said portion is connected to the input of a first stage of said portion of stages through a respective multiplexer connected to said first stage.

* * * * *